United States Patent
Yoshida

[11] Patent Number: 6,137,295
[45] Date of Patent: Oct. 24, 2000

[54] METHOD OF DETECTING DEFECT OF INTEGRATED CIRCUIT AND APPARATUS THEREOF

[75] Inventor: Eiji Yoshida, Tokyo, Japan

[73] Assignee: Mitsubishi Denki Kabushiki Kaisha, Tokyo, Japan

[21] Appl. No.: 09/079,283

[22] Filed: May 15, 1998

[30] Foreign Application Priority Data

Nov. 20, 1997 [JP] Japan ................................. 9-319829

[51] Int. Cl.[7] .................................................. G01R 31/305
[52] U.S. Cl. .................................. 324/751; 250/310
[58] Field of Search .............................. 324/750, 751; 250/310, 311; 348/87

[56] References Cited

U.S. PATENT DOCUMENTS

| | | |
|---|---|---|
| 4,417,203 | 11/1983 | Pfeiffer et al. .............................. 324/51 |
| 4,712,057 | 12/1987 | Pau ........................................ 324/73 R |
| 5,821,761 | 10/1998 | Shida et al. .............................. 324/451 |
| 5,966,019 | 10/1999 | Borden .................................... 324/752 |

OTHER PUBLICATIONS

Peter Ullmann, et al., "A New Robust Backside Flip–Chip Probing Methodology", ISTFA 1996, pp. 1–6, (month unavailable).

*Primary Examiner*—Safet Metjahic
*Assistant Examiner*—Russell M. Kobert
*Attorney, Agent, or Firm*—Oblon, Spivak, McClelland, Maier & Neustadt, P.C.

[57] ABSTRACT

A defect of an integrated circuit is detected by directly observing the operation of an element with an electron beam tester. Portion (1$j$) including the formation region of an element is removed from an SOI substrate (1$s$) on which the integrated circuit is formed. The potential change in a diffusion region (1$e$) is observed by irradiating electron beam from the rear side of the SOI substrate (1$s$).

10 Claims, 12 Drawing Sheets

METHOD OF DETECTING DEFECT OF INTEGRATED CIRCUIT AND APPARATUS THEREOF

BACKGROUND OF THE INVENTION

1. Field of the Invention

The present invention relates to a method of detecting a defect of a semiconductor integrated circuit and an apparatus thereof. In particular, the invention relates to a method of detecting a defect of a semiconductor integrated circuit in which electron beam (hereinafter referred to as "EB") is irradiated from the rear side of a semiconductor substrate of the semiconductor integrated circuit to observe it, as well as an apparatus thereof.

2. Description of the Background Art

Recently, the need for higher detectivity and efficiency of defect detection has become increasingly important in the fault analytic techniques of semiconductor integrated circuits. To detect a defect of an integrated circuit having more large scale, multi-layer, and high-level function, it is necessary to inspect not only failure information obtained from signals that are outputted outside from an integrated circuit but also information related to signals transferred within the integrated circuit. As an example of semiconductor analyzers to make such inspection, there are EB testers in which EB serves as a probe and the potential waveform and potential contrast image of an internal metal wire in a semiconductor integrated circuit as a device under test are observed in non-contact manner. That is, the EB testers are a semiconductor analyzer in which the potential states of wires constituting a semiconductor integrated circuit are observed while operating the circuit. In order to detect a defect on the inside of a large scale integrated circuit having a high-level function, an EB tester is indispensable. For detailed defect of a defective device, it is necessary to observe the potential state of an internal circuit and to trace a defective wire by utilizing tools, such as a CAD navigation. Japanese Patent Laying Open Gazette No. P09-054145 discloses a fault diagnostic apparatus for integrated circuits, by employing tools, such as a CAD navigation.

FIG. 12 is a cross-sectional view of a device under test in a conventional measuring method employing an EB tester. A device under test 1 is generally housed in a resin package 2. The device 1 is an integrated circuit formed on an SOI (Silicon On Insulator) substrate. Semiconductors other than silicon may be used for this substrate. An SOI substrate 1s constituting the device 1 comprises a silicon layer 1a of several hundred μm thick, a thin insulating layer 1c, and an SOI layer 1b, which are stacked in this order. To diffusion regions 1e of MOS (Metal Oxide Semiconductor) transistors arranged in a plane on the SOI substrate 1s, electrical connections of various patterns are feasible by a metal wire 1f of a first wiring layer and a metal wire 1g of a second wiring layer. Electrical connection between the integrated circuit and the outside is made through a lead 3.

In a conventional measuring state as shown in FIG. 12, the upside of the resin package 2 (i.e., the side on which the SOI layer 1b is present as viewed from the insulating layer 1c) is unsealed and part of a protection film 1h is removed to expose the metal wire 1g and the like.

FIG. 13 is a schematic diagram showing an example of use of a conventional EB tester. An EB tester 10 has a monitor 10a that displays the potential waveform and potential contrast image of a device under test 1. In order to bring the atmosphere of the device 1 into the vacuum, the device 1 is placed in a vacuum chamber 10b of the EB tester 10. The device 1 is connected to a DUT (Device Under Test) board 12. To display a potential contrast image and the like on the monitor 10a, the device 1 is driven by signals supplied from a bus 11a of a testing set 11 through the DUT board 12. With the device 1 driven, EB 15 is directly irradiated to the device 1 by an EB irradiation unit 13. Unsealing of the upside of the resin package 2, as shown in FIG. 12, permits a direct irradiation of the EB 15 to the device 1. Since part of the protection film 1h formed on the surface of the device 1 is removed so as to reach the metal wires 1f, 1g, it is possible to detect secondary electrons 16 generated when the EB 15 strikes the surfaces of the metal wires 1f, 1g, by a secondary electron detector 14. That is, the potential contrast images of the metal wires 1f, 1g and the like are obtainable by using the device under test 1 as shown in FIG. 12.

In the conventional methods of detecting a defect of a semiconductor integrated circuit and their apparatuses with the above stated construction, it is difficult to trace a defective wire only by the observation of the surface due to the large-scale integration and multi-layer of integrated circuits. In addition, since metal wires are the subject of observation, it is impossible to directly observe at the level of elements constituting an integrated circuit. It is expected that as semiconductor integrated circuits have more large scale, multi-layer and large-scale integration, their fault analyses become more difficult. Therefore, the importance of this problem will raise in the future.

SUMMARY OF THE INVENTION

According to a first aspect of the present invention, a method of detecting a defect of an integrated circuit comprises the steps of: observing secondary electrons influenced by a potential of a diffusion region in the integrated circuit which is formed on a first surface of a semiconductor substrate, by irradiating electron beam to a second surface of the semiconductor substrate with the integrated circuit operated; and detecting a defect of the integrated circuit from a result of the step of observing.

According to a second aspect of the present invention, the method of the first aspect is characterized in that the integrated circuit is formed on a semiconductor layer overlying an insulating layer; and the step of observing includes an etching the semiconductor layer using the insulating layer as a stopper.

According to a third aspect of the present invention, the method of the third aspect is characterized in that the step of observing includes removing the insulating layer.

According to a fourth aspect of the present invention, the method of the first aspect is characterized in that the step of observing includes recognizing a position of an image obtained from the secondary electrons on the semiconductor substrate by using one of a wiring pattern image viewed from the second surface and a layout diagram viewed from the second surface showing the semiconductor substrate viewed from the second surface side by a camera that takes an image based on light transmitting the semiconductor substrate.

According to a fifth aspect of the present invention, the method of the seventh aspect is characterized in that the step of observing includes designating a position to be observed according to the layout diagram viewed from the second surface and the wiring pattern image viewed from the second surface.

According to a sixth aspect of the present invention, the method of the ninth aspect is characterized in that the step of observing includes matching a needle of a probe card with a predetermined position of a wafer by magnifying means that magnifies a surface of the wafer having the semiconductor substrate.

According to an seventh aspect of the present invention, an apparatus of detecting a defect of an integrated circuit, comprises: electron beam irradiator irradiating electron beam to a semiconductor substrate, from an opposite side to a surface of the semiconductor substrate on the surface of which the integrated circuit is formed, to obtain secondary electrons occurred from the semiconductor substrate; and a camera taking an image of a wire of the integrated circuit from the opposite side based on light transmitting the semiconductor substrate.

According to a eighth aspect of the present invention, an apparatus for detecting a defect of an integrated circuit, comprises: electron beam irradiator irradiating electron beam to an opposite side to a surface of a wafer, on the surface of which the integrated circuit is formed, to obtain secondary electrons from the opposite side; a prove card that supplies electric signal and power to the wafer from the surface of the wafer; and magnifying means for obtaining a magnified image of the surface of the wafer in order to apply a needle of the prove card to the wafer.

In the method of detecting a defect of an integrated circuit according to the first aspect, thanks to EB irradiated to the rear side of a semiconductor substrate with semiconductor elements operated, it is possible to observe the potential waveforms and potential contrast images of diffusion regions at level of a semiconductor element, facilitating an efficient defect detection at level of element.

In the method of detecting a defect of an integrated circuit according to the second aspect, the use of an insulating layer as a stopper facilitates the reduction of a semiconductor substrate thickness to such an extent that elements constituting the semiconductor integrated circuit are operable, thus facilitating a defect detection of high accuracy.

In the method of detecting a defect of an integrated circuit according to the third aspect, the removal of an insulating layer permits a direct EB irradiation to a semiconductor layer, further improving observation accuracy.

In the method of detecting a defect of an integrated circuit according to the fourth aspect, it is possible to recognize a wire of a semiconductor integrated circuit by light transmitting a semiconductor substrate, thereby improving the accuracy of defect detection.

In the method of detecting a defect of an integrated circuit according to the fifth aspect, it is possible to recognize an element causing an abnormal operation on a layout diagram, facilitating a defect detection.

In the method of detecting a defect of an integrated circuit according to the sixth aspect, a needle of a probe card can be readily applied to the surface of a wafer by magnifying means.

In accordance with the EB tester of the seventh aspect, it is possible to recognize a wire of a semiconductor integrated circuit by an infrared camera, improving the accuracy of failure location detection.

In accordance with the EB tester of the eighth aspect, even when it is impossible to employ EB in recognizing the position of an integrated circuit formed on a wafer because the EB is irradiated from the rear side of the wafer, magnifying means facilitates the recognition of a position to which a needle of a probe card is applied.

It is an object of the present invention to detect a defect for a semiconductor integrated circuit as a device under test with high detectivity and efficiency by observing a potential waveform and potential contrast image at level of element, e.g., a diffusion region of an MOS transistor.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

A method of detecting a defect of a semiconductor integrated circuit according to a first preferred embodiment of the present invention is described hereafter by referring to FIGS. 1 to 4.

Figure 1:
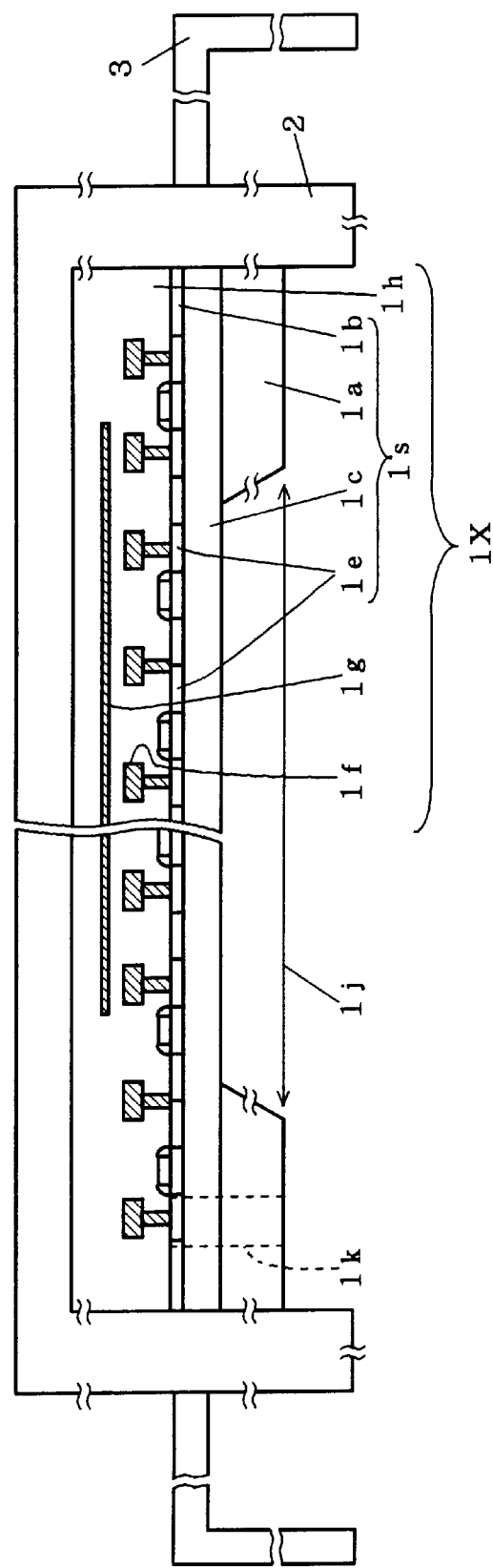
FIG. 1 is a cross-sectional view showing an example of shapes of a device under test after being worked according to a first preferred embodiment of the present invention.

FIG. 1 is a cross-sectional view showing an example of shapes of a device under test after being worked according to the first preferred embodiment. In FIG. 1, a device under test 1X (a semiconductor integrated circuit) is prepared using an SOI substrate 1s and is sealed in a resin package 2 before being worked as a specimen. In the observation conditions by a method of detecting a defect in the first preferred embodiment, the rear side (i.e., the side on which a silicon layer 1a is present as viewed from an insulating layer 1c) of the resin package 2 is unsealed. As in the integrated circuit shown in FIG. 12, the device 1X is an integrated circuit formed on the SOI substrate 1s. Also in the SOI substrate 1s of the device 1X, electrical connections of various patterns are made to diffusion region 1e of MOS transistors arranged in a plane on the SOI substrate 1s by a metal wire 1f of a first wiring layer and a metal wire 1g of a second wiring layer, and the electrical connection between the integrated circuit and the outside is made through a lead 3.

Figure 12:
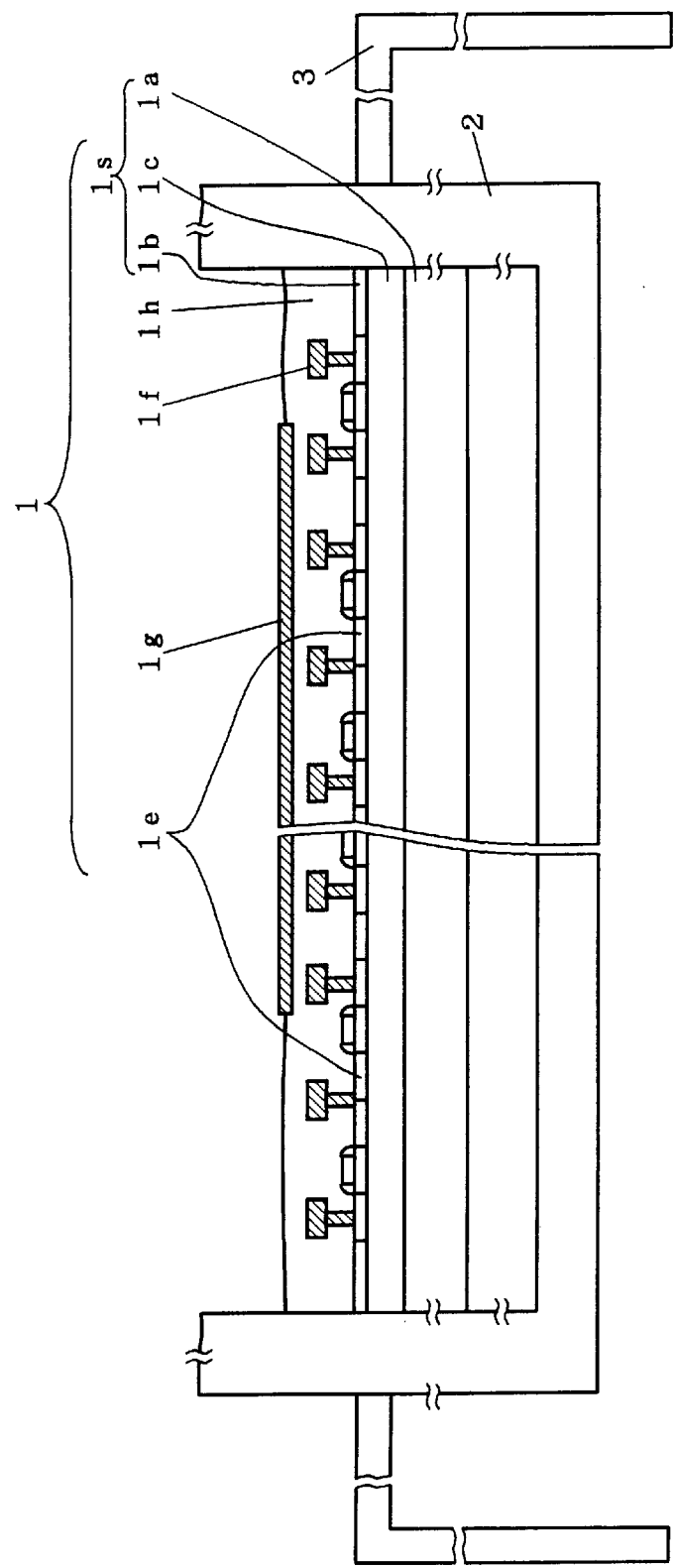
FIG. 12 is a cross-sectional view showing a device under test in a conventional measuring method using an EB tester.

The device under test 1X of FIG. 1 differs from the device under test 1 of FIG. 12 in that a portion 1j including the formation region of an element to be observed in the silicon layer 1a of the device 1X is removed so as to reach the insulating layer 1c. Since the device 1X is observed from the rear side, it is of course unnecessary to remove a protection film 1h on the surface of the device 1X. Although part of the silicon layer 1a is removed in the device 1X, the MOS transistors and the wires are free from damage and are maintained thanks to the protection film 1h present on the surface and the resin package 2.

Secondary electrons being occurred by EB to the device 1X are influenced by the potential of diffusion regions 1e of the MOS transistors and the like. However, since the silicon layer 1a generally has about several hundred μm thick, it is difficult to sense the potential change in the diffusion regions 1a through the silicon layer 1a by using EB. For this, the portion 1j including the formation region of an element to be observed is removed. The insulating layer 1c overlying the SOI substrate 1s is generally thin. It is therefore possible to sense the potential change caused in the diffusion regions 1e on the surface of the insulating layer 1c by utilizing secondary electrons occurred when EB is irradiated to the insulating layer 1c.

In working the device under test 1X as a specimen, firstly the rear side of the resin package 2 is removed by a known method, and the silicon layer 1a corresponding to the portion 1j that includes the region in which an element to be observed is formed is mechanically ground to the vicinity of the insulating layer 1c. Further, by using the insulating layer 1c as a stopper, a wet etching is performed to remove the silicon layer 1a corresponding to the aforesaid portion 1j, thereby obtaining the device 1X shown in FIG. 1.

Figure 2:
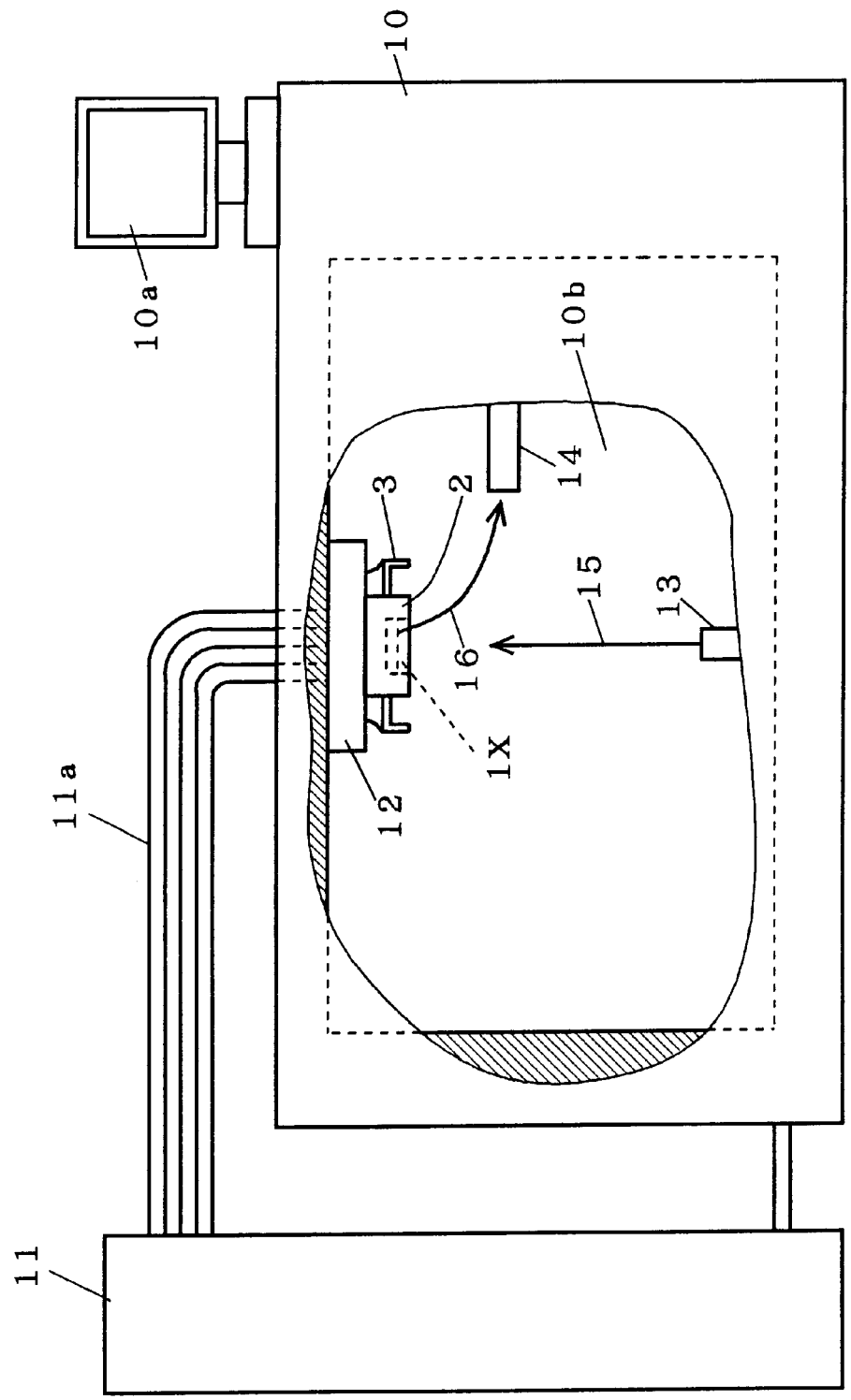
FIG. 2 is a schematic view showing an example of use of an EB tester according to the first preferred embodiment.
Figure 13:
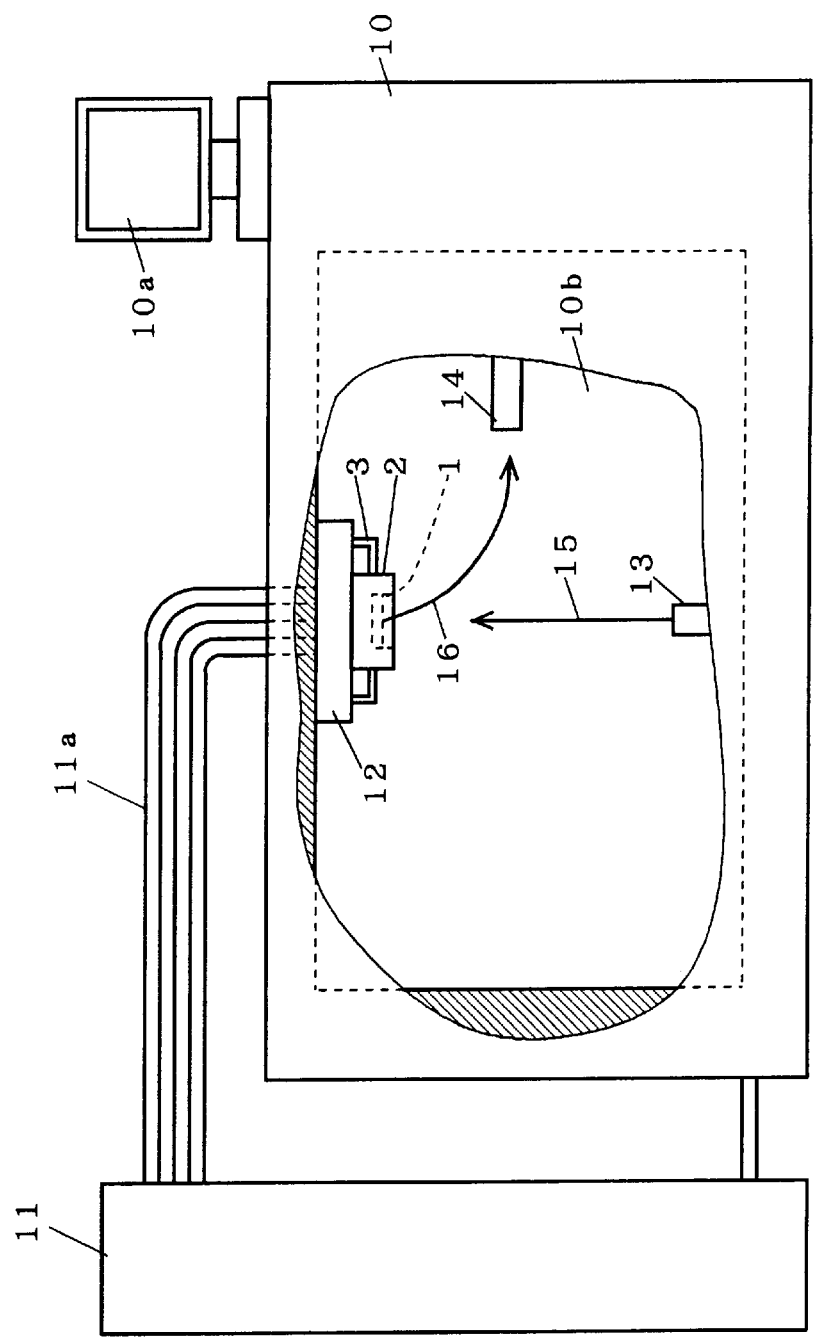
FIG. 13 is a schematic diagram showing an example of use of a conventional EB tester.

FIG. 2 is a schematic diagram showing an example of use of an EB tester according to the first preferred embodiment. An EB tester of FIG. 2 is similar to that shown in FIG. 13 as used in the conventional method, except for a device under test 1X connected to a DUT board 12. Since the rear side of the device 1X is directed to an EB irradiation unit 13, the connection between the device 1X and the DUT board 12 cannot be made by fixing a lead 3 into the DUT board 12. Therefore, the connection between the two is attained for example by soldering a socket on the DUT board 12 to the lead 3.

From the rear side of the device 1X driven by a testing set 11, EB 15 is irradiated to the exposed embedded insulating layer 1c by an EB tester 10. The EB 15 reaches the insulating layer 1c directly beneath diffusion regions 1e of MOS transistors. By detecting secondary electrons 16 generated from the insulating layer 1c, the potential waveforms and potential contrast images of the diffusion regions 1e of the MOS transistors are observed.

Figure 3:
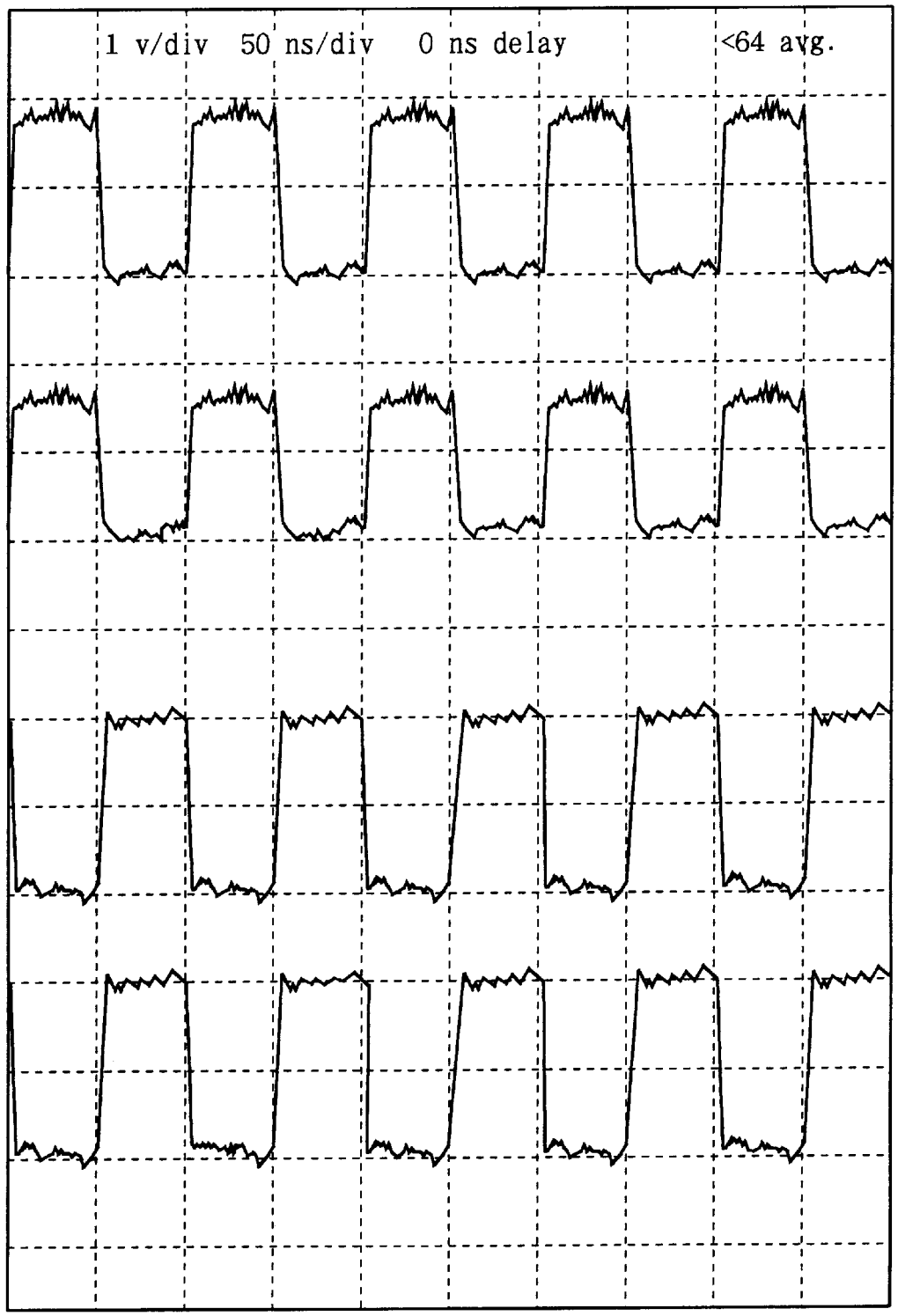
FIG. 3 is a diagram showing an example of waveforms of a device under test.
Figure 4:
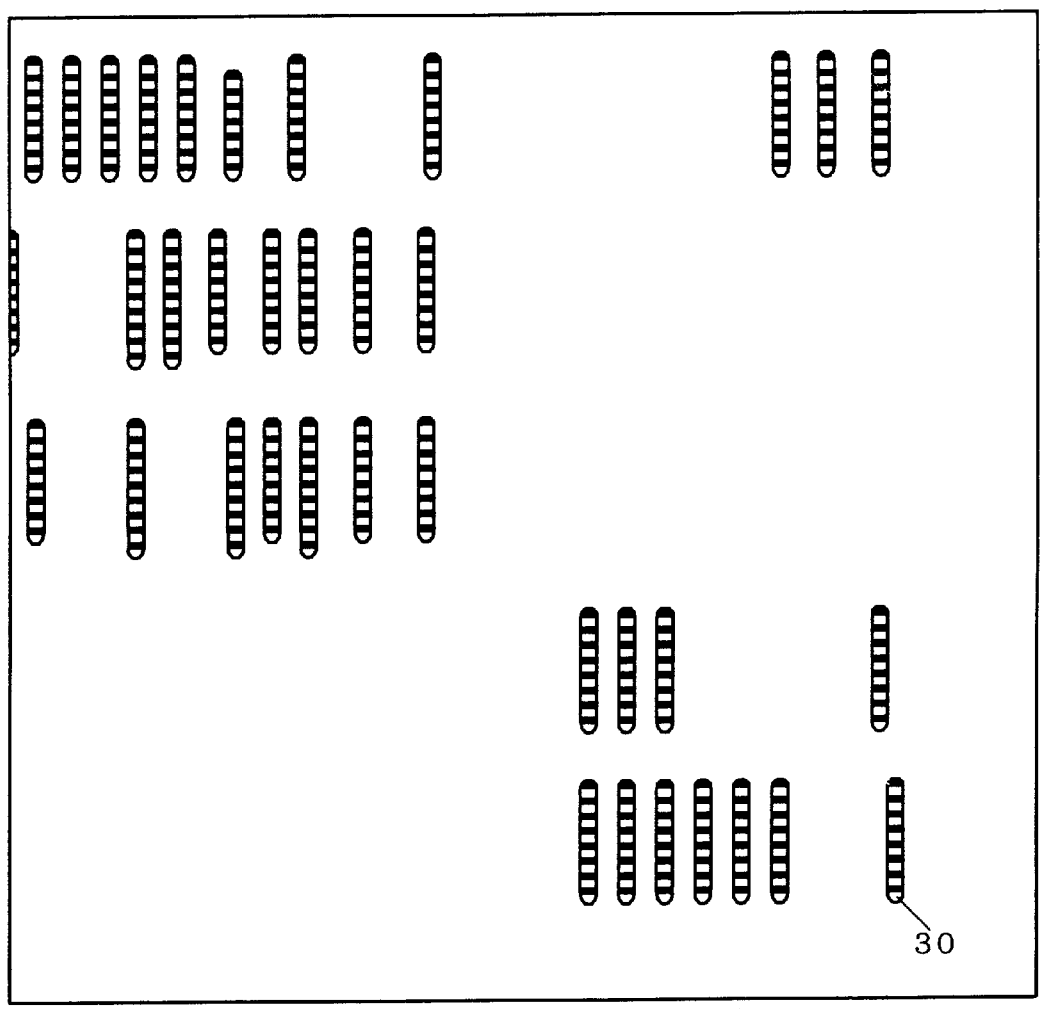
FIG. 4 is a pictogram illustrating a potential waveform of a device under test.

FIGS. 3 and 4 show an example of the potential waveform and the potential contrast image of the device 1X thus observed, respectively.

In FIG. 3, there are plotted the potential waveforms of four diffusion regions whose potential amplitude center is shifted, wherein one section of the ordinate corresponds to 1 V, and one section of the abscissa corresponds to 50 ns.

FIG. 4 shows the potential contrast images obtained by a strobe function of the EB tester 10. In portions 30 indicated by black-and-white contrast, white portions have a low potential while black portions have a high potential. A row of the portions 30 corresponds to one of the diffusion regions 1e of the MOS transistors (i.e., a source or drain region).

By irradiating EB from the rear side of the device 1X and detecting the secondary electrons due to the EB, it is possible to directly observe the potential waveforms and potential contrast images of the diffusion regions 1e of the MOS transistors, not metal wires. As a result, the logic operation states of elements, such as MOS transistors, for which it is difficult to perform observation from the surface, can be readily detected with high efficiency. The method of detecting a defect of a semiconductor integrated circuit is particularly suitable for devices, e.g., multi-layer interconnection devices and flip-chip devices, for which a satisfactory analyses cannot be obtained by the EB test in which EB is irradiated from the surface.

As a method of observing from the rear side of a semiconductor device by utilizing infrared ray, Japanese Patent Laying Open Gazette No. P07-035697 discloses a method in which a reversed image data is superimposed with an image obtained from infrared ray irradiated to the rear side. In this method, a defect is analyzed by utilizing very weak light occurred from an abnormal location when a bias is applied to a semiconductor device. However, not all observations are directed to a direct observation as to whether the operation of an element is abnormal or not. Accordingly, in some cases it is impossible to directly detect whether an element causes an abnormal operation.

To detect a defect, it is necessary to designate a location to be observed. As shown in FIG. 1, a hole 1k penetrating through a silicon layer 1a, an insulating layer 1 and an SOI layer 1b, is provided by means of, e.g., etching, so that the wires on the surface of an integrated circuit are directly observed from the rear side. The alignment between the device under test 1X and the EB irradiation unit 13 is made by a wiring pattern that can be seen from the hole 1k, to determine a location to be observed. The number of the hole 1k is preferably in a plural, for example, three or four holes 1k are provided. Here, the location of the hole 1k in an integrated circuit is limited to places in which the operation of the integrated circuit is not hindered, e.g., where no elements are formed.

Figure 5:
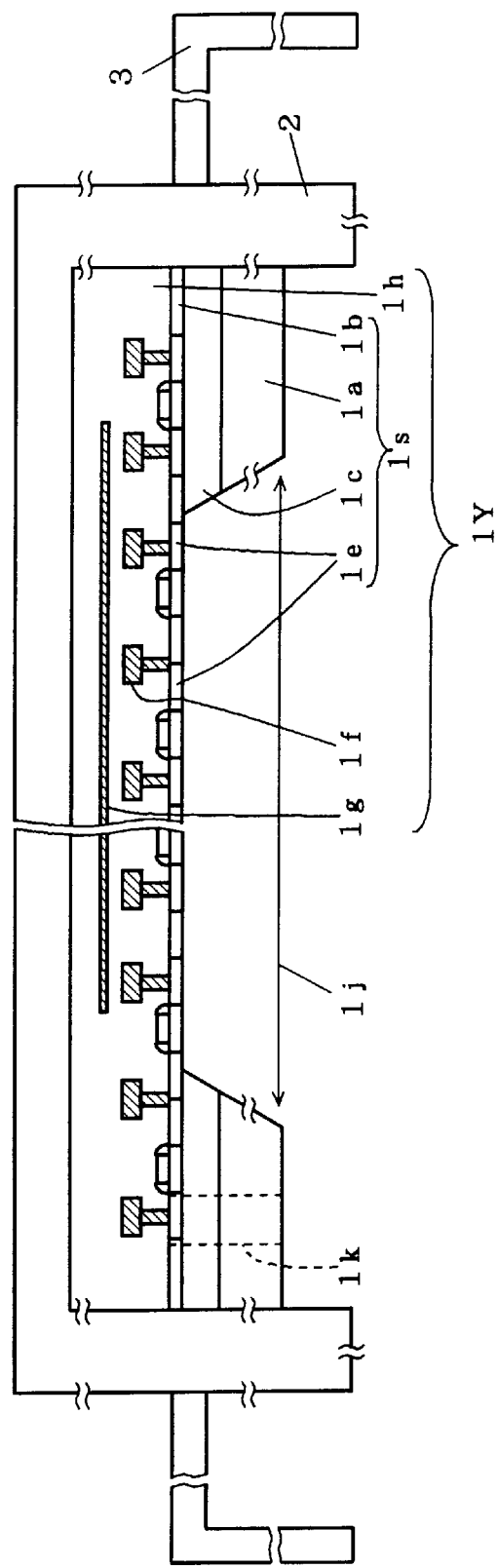
FIG. 5 is a cross-sectional view showing another shape of a device under test after being worked according to the first preferred embodiment.

FIG. 5 is a cross-sectional view showing another shape of a device under test after being worked. In FIG. 5, the same reference number as in FIG. 1 designates the corresponding part. In a specimen for EB tester (a device under test 1Y) shown in FIG. 5, an SOI layer 1b is exposed. When used the specimen of FIG. 5, a potential contrast image can be easily viewed and a potential waveform can be observed with high precision because no secondary electrons are accumulated in an insulating layer 1c, as compared to the use of the specimen of FIG. 1. In addition, since the SOI layer 1b is left, the operation of semiconductor elements is possible.

To obtain the device 1Y of FIG. 5, the insulating layer 1c is removed by an etching using the SOI layer of the device 1X in FIG. 1 as a stopper.

Figure 6:
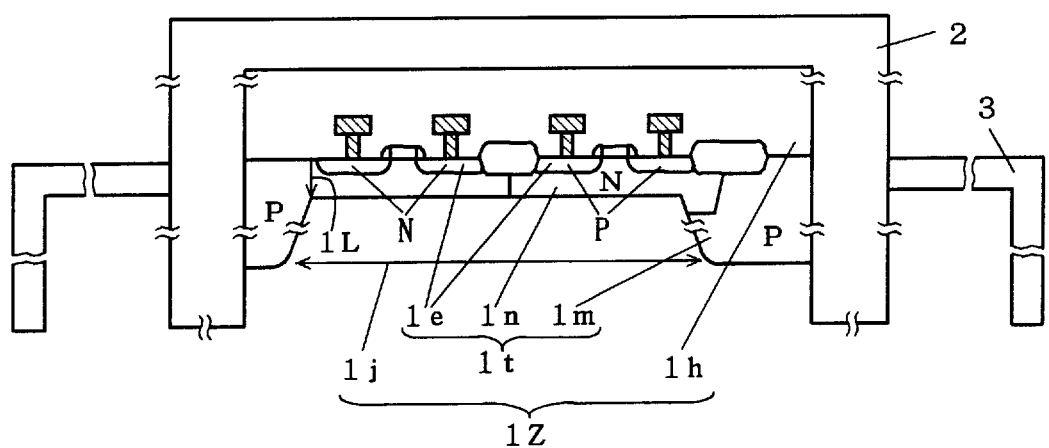
FIG. 6 is a cross-sectional view showing another example of a test under test according to the first preferred embodiment.

FIG. 6 is a cross-sectional view showing another example of a device under test according to the first preferred embodiment. In FIG. 6, the same reference number as in FIG. 1 designates the corresponding part. A specimen for EB tester (a device under test 1Z) shown in FIG. 6 has a silicon substrate 1t of several hundred μm thick that comprises a p-type silicon layer 1m and a well 1n. The silicon substrate 1t is etched so that a predetermined thickness 1L is left in a region to be observed. The thickness 1L is greater than that of diffusion regions 1e and is set so as not to inhibit the operation of an integrated circuit. Here, too large thickness 1L may affect the potential waveform and potential contrast image observations which are performed by irradiating EB. Accordingly, the thickness 1L is limited to such an extent that the potential changes in the diffusion regions 1e are reflected in secondary electrons to make an EB testing possible.

Second Preferred Embodiment

Figure 7:
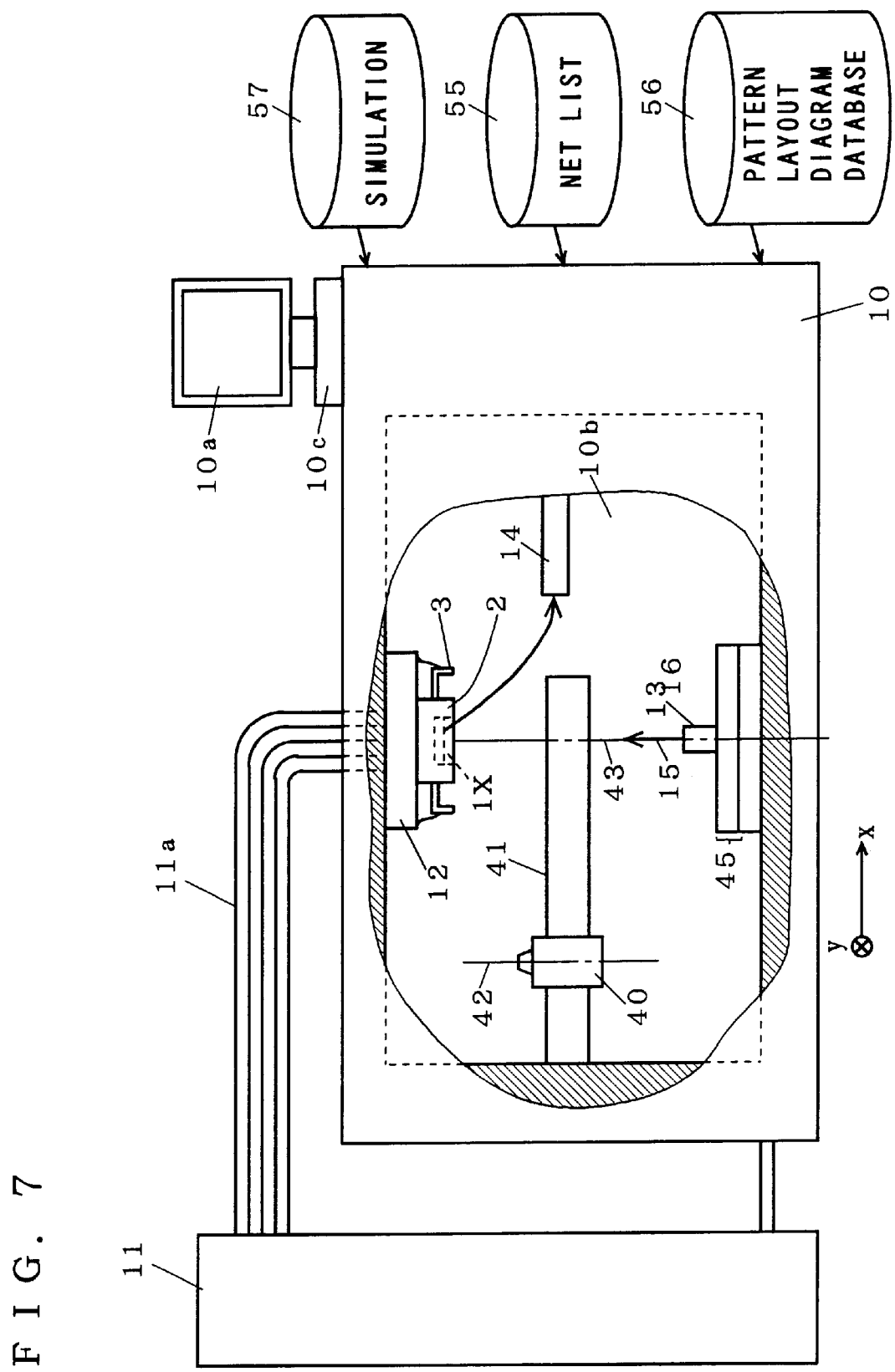
FIG. 7 is a schematic diagram showing an example of constructions of an EB tester according to a second preferred embodiment of the present invention.

A method of detecting a defect of a semiconductor integrated circuit and an apparatus thereof according to a second preferred embodiment of the present invention are described hereafter by referring to FIG. 7.

As shown in FIG. 7, an infrared camera 40 is positioned on a switching stage 41 in a vacuum chamber 10b of an EB tester 10. The infrared camera 40 is used in observing a wiring pattern of the rear surface of a device under test 1X. To observe a wiring pattern formed on the surface of the device 1X, it is required an infrared camera 40 having the sensitivity in an infrared region ($\lambda$=1100 nm or more) whose wavelength is longer than that of the wavelength absorption band of silicon ($\lambda$=less than 1100 nm). That is, the infrared camera 40 can detect the reflected light from the device 1X when irradiating the infrared light of a wavelength in a region different from the wavelength absorption band of a silicon layer 1a.

A central axis 43 of EB 15 is removable by an XY stage 45 on which an EB irradiation unit 13 is mounted. The infrared camera 40 is shifted in the X and Y directions by a switching stage 41, and can take a wiring pattern image as viewed from the rear side of the device 1X, i.e., the rear wiring pattern image, by matching a center 42 of the visual field of the camera 40 with the central axis 43 of the EB 15.

To perform an EB test from the rear side, it is necessary to recognize the positions of diffusion regions 1e of MOS transistors and the like, to which the EB 15 is irradiated. Firstly, the rear wiring pattern to which the EB 15 is irradiated as stated above is observed by the infrared camera 40. Then, the infrared camera 40 is shifted by the switching stage 41 to such an extent that the irradiation of the EB 15 is ensured, and the EB 15 is then irradiated to observe the potential contrast image and the like.

The operations of the EB irradiation unit 13, the XY stage 45, the infrared camera 40 and the switching stage 41 are all controlled by a controller 10c.

Figure 8:
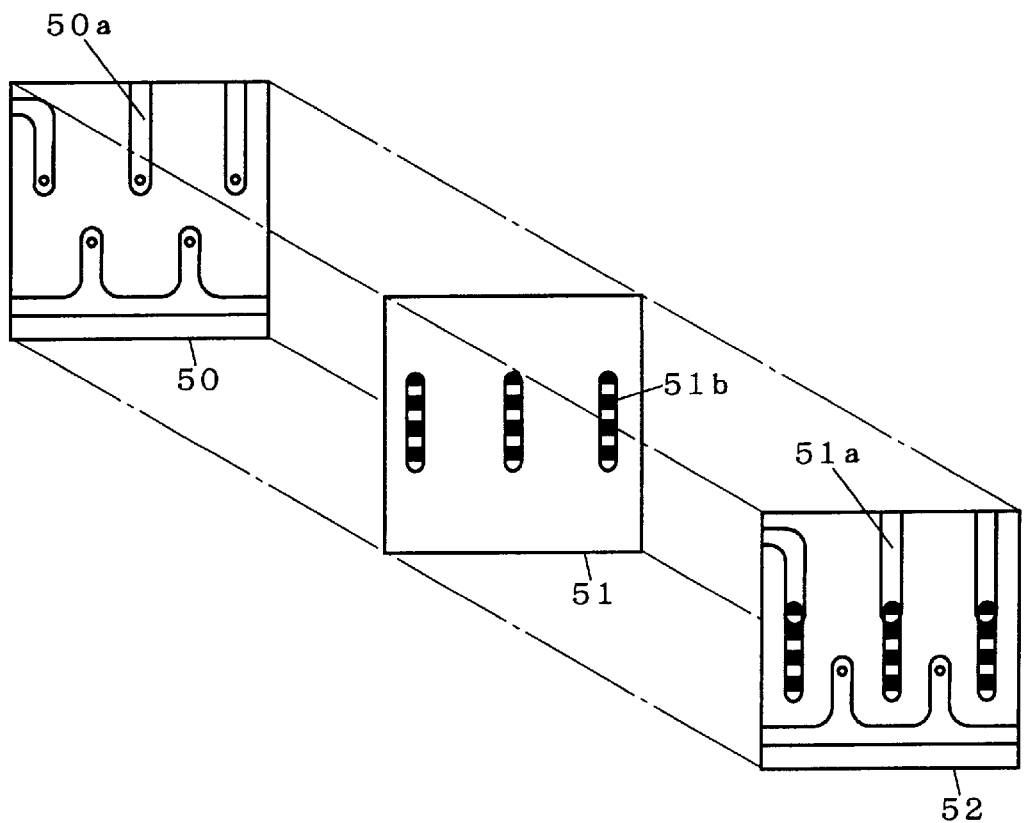
FIG. 8 is a diagram showing a concept of synthesizing a rear wiring pattern image and a potential contrast image.

As described earlier, the infrared camera 40 is indispensable for obtaining the rear wiring pattern of the device under test 1X (a semiconductor integrated circuit). In the first preferred embodiment the position of a wiring pattern is recognized by drilling a hole from the rear side of the device under test 1X. Whereas in the method of detecting a defect and its apparatus of the second preferred embodiment, by recognizing a rear wiring pattern with the infrared camera 40 positioned in the vacuum chamber 10b of the EB tester, it is possible to carry out an EB test from the rear side while matching the rear wiring pattern image with a potential contrast image or the like. For instance, with the EB tester 10 shown in FIG. 7, it is possible to display, as shown in FIG. 8, an image 52 in which a rear wiring pattern image 50 taken by the infrared camera 40 is superposed with a potential contrast image 51 obtained by using the EB 15. The relation between a high brightness portion 51b of the image 52 and a rear wiring pattern 50a makes clear the correspondence between the rear wiring pattern 50a and the positions of the diffusion regions 1e. The potential contrast image 51 corresponds to the potential contrast image as shown in FIG. 4.

Therefore, the observation of the rear wiring pattern and the EB test can be performed in sequence without taking the device 1X out of the vacuum chamber 10b, thus improving alignment accuracy, operability, and analysis efficiency.

Although the second preferred embodiment demonstrates the case of employing the infrared camera 40, there may be used light other than infrared, i.e., light that can transmit a semiconductor substrate and also be reflected by metal. Even when a camera taking an image based on such light is used in place of the infrared camera 40, the resulting effect is the same as the second preferred embodiment.

Third Preferred Embodiment

Figure 9:
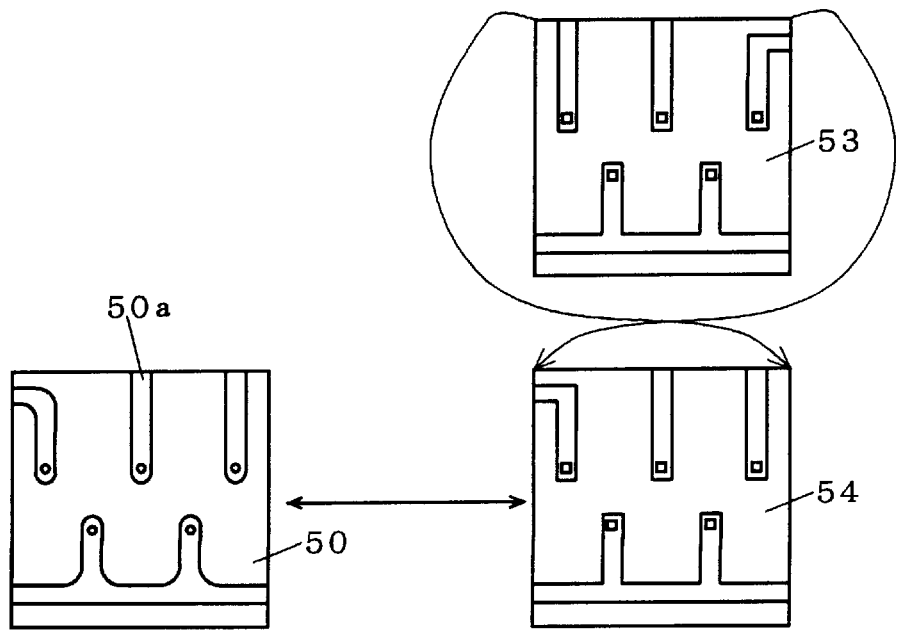
FIG. 9 is a diagram showing a concept of an alignment step employing a rear wiring pattern image and a rear layout diagram.
Figure 10:
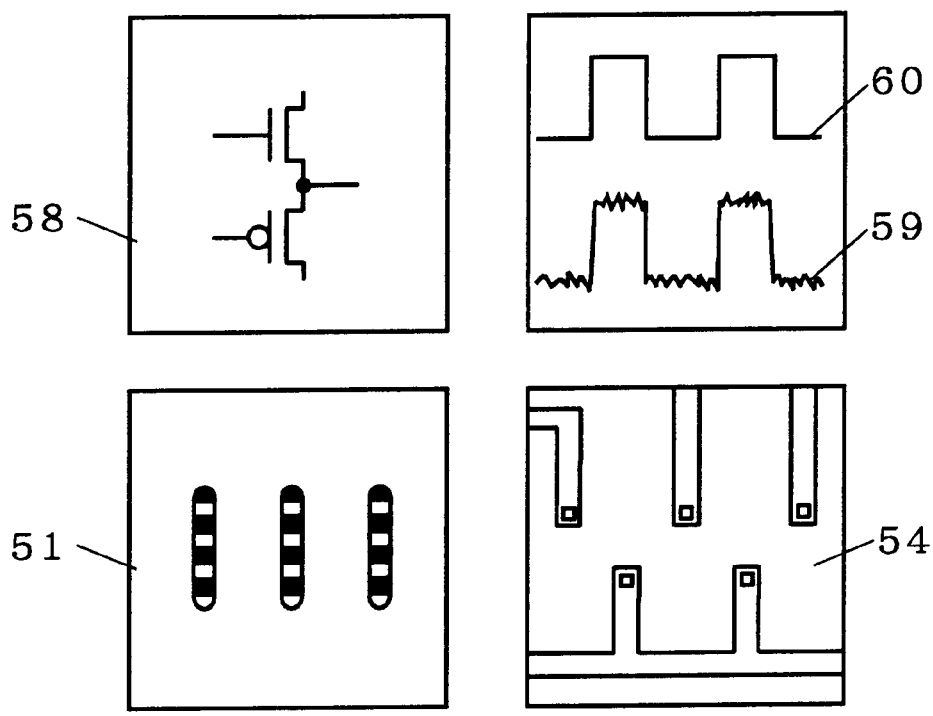
FIG. 10 are pictograms showing a transistor level circuit diagram, a rear layout diagram, a rear wiring pattern image, and a transistor level simulation waveform, which are all linked.

A method of detecting a defect of a semiconductor integrated circuit and an apparatus thereof according to a third preferred embodiment of the present invention are described hereafter by referring to FIGS. 7, 9 and 10. Data of a pattern layout diagram 53 for a device under test 1X, as shown in FIG. 9, is inputted from a pattern layout diagram database 56 to an EB tester 10, as shown in FIG. 7. The pattern layout diagram 53 is obtained in designing the device 1X. With reference to FIG. 9, a diagram of the reversed pattern layout diagram 53 as viewed from the rear side, i.e., a rear layout diagram 54, is prepared by a well-known method with the EB tester 10.

By matching the rear layout diagram 54 with the rear wiring pattern image 50, i.e., the alignment between the two, the position to which EB 15 is irradiated to execute observation can be recognized on the rear layout diagram 54. Instead of the rear wiring pattern image 50, the image 52 in which the rear wiring pattern image is superposed with the potential contrast image may be employed for the alignment. The alignment can be performed in the same manner as prior art because the difference from prior art is that the rear layout diagram 54 is used in place of the pattern layout diagram 53 viewed from the surface as used in the prior art.

The aforementioned step is repeated for three or four locations after shifting the irradiation position of the EB 15, to confirm whether the positional recognition on the rear layout diagram 54 is correct or not. This enables to link the irradiation position of the EB 15 and the display of the rear layout diagram 54. As a result, the irradiation position of the EB 15 can be designated on the rear layout diagram 54, allowing to link a transistor level circuit diagram 58 and the irradiation position of the EB 15. This results in the link between a potential waveform diagram 59 and the transistor level circuit diagram 58. In addition, it is able to display a potential contrast image 51 for the location to which the EB 15 is irradiated, and the rear layout diagram 54 for that location. Under the conditions that the respective links are executed as described, the transistor level circuit diagram 58 linked to the rear layout diagram 54 is for example obtained by giving a net list data 55 to the EB tester 10. Additionally, since the irradiation position of the EB 15 is designated at level of transistor, a simulation waveform 60 can be displayed so as to link to the potential waveform 59. The simulation waveform 60 can be displayed by giving a simulation data 57 to the EB tester 10.

As shown in FIG. 10, a CAD navigation of element level into the device under test 1X (a semiconductor integrated circuit) is carried out by linking the rear layout diagram 54, the potential contrast image 51 (or the image 52 in which the potential contrast image 51 is superposed with the rear wiring pattern image 50), the transistor level circuit diagram 58, and the transistor level simulation waveform 60 as an expected value of a measured waveform.

With the aforesaid CAD navigation, to trace the potential waveform or potential contrast image from the input or output side of the rear side of the device 1X to the inside of the circuit, permits a defect detection at level of transistor, which has been impossible by the conventional EB test from the surface, with high detectivity and efficiency.

Fourth Preferred Embodiment

Figure 11:
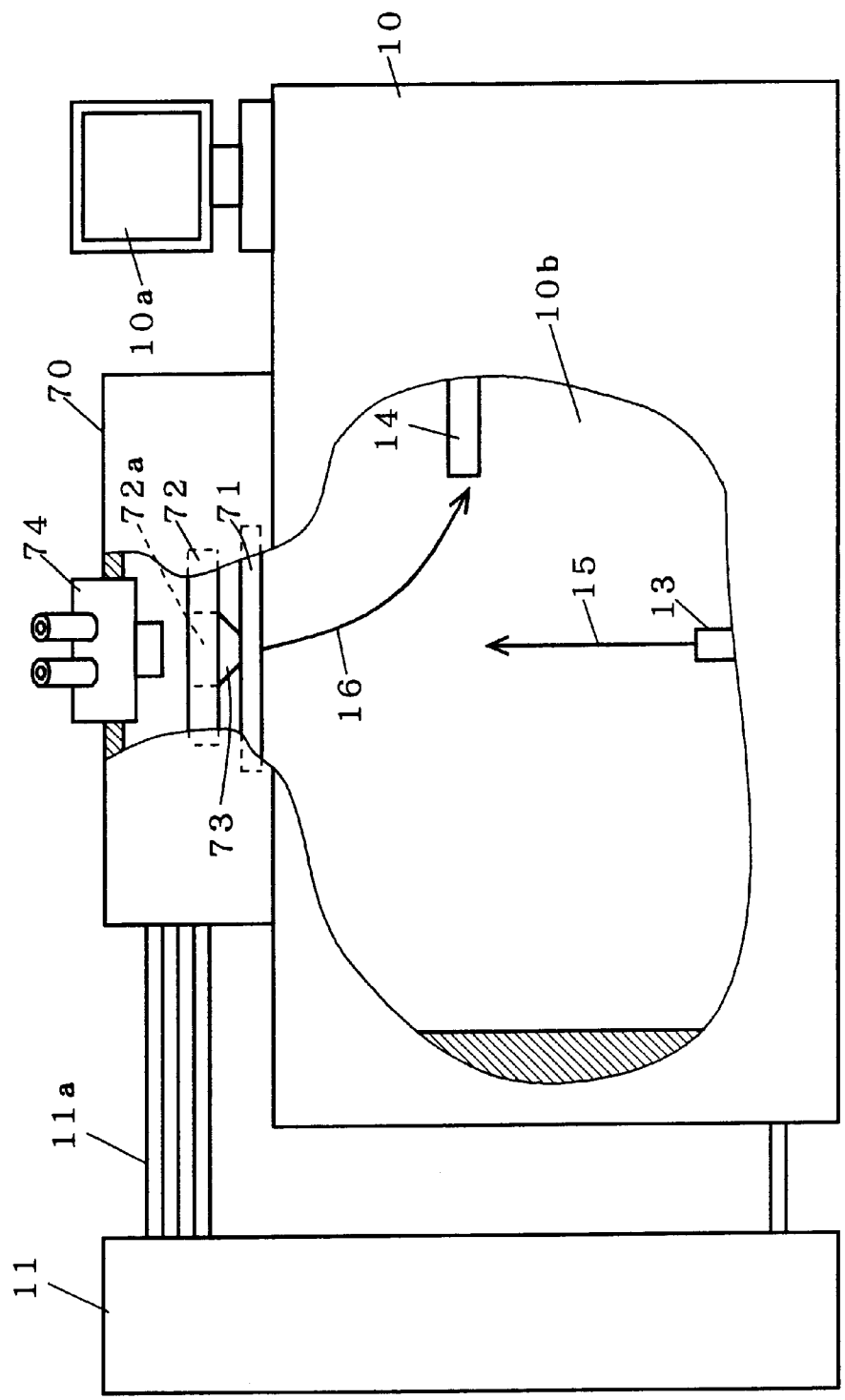
FIG. 11 is a schematic diagram showing an example of construction of an EB tester according to a fourth preferred embodiment of the present invention.

A method of detecting a defect of a semiconductor integrated circuit and an apparatus thereof according to a fourth preferred embodiment of the present invention are described hereinafter by referring to FIG. 11.

In an apparatus of detecting a defect according to the fourth preferred embodiment, a wafer stage 70 is added which is used in evaluating an integrated circuit in a wafer state. The interior side of the wafer stage 70 is connected to a vacuum chamber 10b of an EB tester 10 and is brought into the vacuum state during observation. A wafer 71 is secured in the wafer stage 70. EB 15 is irradiated from the rear side of the wafer 71. To analyze the operation of elements formed on the surface of the wafer 71, part of the wafer 71 to be observed is ground from the rear side to reduce its thickness, as in the device under test 1X.

When an EB test from the rear side is performed at level of wafer, a needle 73 of a probe card 72 is brought into contact with a metal pad of an integrated circuit under test within the wafer 71. Test signals are sent from a testing set 11 to the probe card 72 through a bus 11a. To transmit the test signals to the integrated circuit under test, the electrical connection between the metal pad and the needle 73 is needed. The needle 73 is magnified by an optical microscope 74 through an opening 72a of the probe card 72 and then observed. This facilitates the contact between the needle 73 and the metal pad under vacuum.

Instead of the optical microscope 74, a miniature camera may be positioned on the wafer stage 70 of the EB tester 10, resulting in the same effect.

While the invention has been shown and described in detail, the foregoing description is in all aspects illustrative and not restrictive. It is therefore understood that numerous modifications and variations can be devised without departing from the scope of the invention.

I claim:

1. A method of detecting a defect of an integrated circuit, comprising the steps of:

observing secondary electrons influenced by a potential of a diffusion region in said integrated circuit which is formed on a first surface of a semiconductor substrate, by irradiating an electron beam to an opposite exposed second surface of said semiconductor substrate with a testing signal applied to said integrated circuit to change a potential of said diffusion region; and detecting a defect of said integrated circuit from a result of said step of observing.

2. The method of claim 1, wherein said step of observing includes matching a needle of a probe card with a predetermined position of a wafer by magnifying means that magnifies a surface of said wafer having said semiconductor substrate.

3. The method of claim 1, wherein said integrated circuit is formed on a semiconductor layer overlying an insulating layer; and said step of observing includes an etching said semiconductor layer using said insulating layer as a stopper.

4. The method of claim 3, wherein said step of observing includes matching a needle of a probe card with a predetermined position of a wafer by magnifying means that magnifies a surface of said wafer having said semiconductor substrate.

5. The method of claim 3, wherein said step of observing includes removing said insulating layer.

6. The method of claim 5, wherein said step of observing includes matching a needle of a probe card with a predetermined position of a wafer by magnifying means that magnifies a surface of said wafer having said semiconductor substrate.

7. The method of claim 1, wherein said step of observing includes recognizing a position of an image obtained from said secondary electrons on said semiconductor substrate by using one of a wiring pattern image viewed from said second surface and a layout diagram viewed from said second surface showing said semiconductor substrate viewed from said second surface by a camera that takes an image based on light transmitting said semiconductor substrate.

8. The method of claim 7, wherein said step of observing includes matching a needle of a probe card with a predetermined position of a wafer by magnifying means that magnifies a surface of said wafer having said semiconductor substrate.

9. The method of claim 7, wherein said step of observing includes designating a position to be observed according to said layout diagram viewed from said second surface and said wiring pattern image viewed from said second surface.

10. The method of claim 9, wherein said step of observing includes matching a needle of a probe card with a predetermined position of a wafer by magnifying means that magnifies a surface of said wafer having said semiconductor substrate.

* * * * *